(12) United States Patent
Zhang et al.

(10) Patent No.: US 8,910,005 B2
(45) Date of Patent: Dec. 9, 2014

(54) SYSTEMS AND METHODS FOR SELECTIVE RETRY DATA RETENTION PROCESSING

(71) Applicant: LSI Corporation, Milpitas, CA (US)

(72) Inventors: Fan Zhang, San Jose, CA (US); Kaitlyn T. Nguyen, San Jose, CA (US); Jun Xiao, Fremont, CA (US)

(73) Assignee: LSI Corporation, San Jose, CA (US)

( * ) Notice: Subject to any disclaimer, the term of this patent is extended or adjusted under 35 U.S.C. 154(b) by 109 days.

(21) Appl. No.: 13/692,908

(22) Filed: Dec. 3, 2012

(65) Prior Publication Data

US 2014/0157074 A1 Jun. 5, 2014

(51) Int. Cl.
*G06F 11/00* (2006.01)

(52) U.S. Cl.
CPC ...................................... *G06F 11/00* (2013.01)
USPC ......................................................... 714/746

(58) Field of Classification Search
CPC ... H04L 1/0045; H04L 1/0057; H04L 1/0061; H04L 1/0071; G11B 20/18
USPC ........................................................ 714/746
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 5,797,020 A | 8/1998 | Bonella et al. | |
| 6,185,620 B1 | 2/2001 | Weber et al. | |
| 6,405,342 B1 | 6/2002 | Lee | |
| 6,438,717 B1 | 8/2002 | Butler | |
| 6,657,803 B1 | 12/2003 | Ling | |
| 7,076,719 B2 | 7/2006 | Anjo et al. | |
| 7,136,244 B1 | 11/2006 | Rothberg | |
| 7,730,384 B2 | 6/2010 | Graef | |
| 7,738,201 B2 | 6/2010 | Jin | |
| 8,443,251 B1 | 5/2013 | Zhang et al. | |
| 8,826,110 B2 * | 9/2014 | Jin et al. ......................... | 714/793 |
| 2010/0275096 A1 * | 10/2010 | Zhong et al. .................. | 714/758 |
| 2011/0258508 A1 * | 10/2011 | Ivkovic et al. ................ | 714/752 |
| 2012/0198129 A1 | 8/2012 | Van Aken et al. | |
| 2013/0332794 A1 * | 12/2013 | Yen et al. ....................... | 714/758 |

FOREIGN PATENT DOCUMENTS

| | | |
|---|---|---|
| EP | 2242054 | 10/2010 |
| WO | WO 2008/087042 | 7/2008 |
| WO | WO 2011/091845 | 8/2011 |

OTHER PUBLICATIONS

Chase, D, "A Class of Algorithms for Decoding Block Codes with Channel Measurement Information" IEEE Transactioons on Info theory, vol. 18, No. 1 Jan. 1, 1972.
Dong-U Lee et al "Pilotless Frame Synchronization via LDPC Code Constraint Feedback" IEEE Comm. Letters, NJ, US vol. 11 No. 8, Aug. 1, 2007.
Olmos et al., "Tree-Structure Expectations Propagation for LDPC Decoding in Erasure Channels", Cornell University Library arXiv:1009.4287 (Sep. 22, 2010).
U.S. Appl. No. 13/459,282, filed Apr. 30, 2012, Fan Zhang, Unpublished.

* cited by examiner

*Primary Examiner* — Albert Decady
*Assistant Examiner* — Enam Ahmed
(74) *Attorney, Agent, or Firm* — Hamilton DeSanctis & Cha

(57) ABSTRACT

Systems, circuits, devices and/or methods related to systems and methods for data processing, and more particularly to systems and methods for re-processing data sets not successfully processed during standard processing.

20 Claims, 8 Drawing Sheets

SYSTEMS AND METHODS FOR SELECTIVE RETRY DATA RETENTION PROCESSING

FIELD OF THE INVENTIONS

Systems, circuits, devices and/or methods related to systems and methods for data processing, and more particularly to systems and methods for re-processing data sets not successfully processed during standard processing.

BACKGROUND

Various data transfer systems have been developed including storage systems, cellular telephone systems, and radio transmission systems. In each of the systems, data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Where a data set fails to converge after an allowable number of iterations, an error is indicated. Where the errors are extensive and extend across a number of surrounding data sets, the error may not be recoverable even where a re-processing approach is implemented.

Hence, for at least the aforementioned reasons, there exists a need in the art for advanced systems and methods for data processing.

SUMMARY

Systems, circuits, devices and/or methods related to systems and methods for data processing, and more particularly to systems and methods for re-processing data sets not successfully processed during standard processing.

Various embodiments of the present invention provide data processing systems that include: a data processing circuit, an input buffer, and a kick out circuit. The data processing circuit is operable to apply a data processing algorithm to a processing input to yield a data output. The input buffer is operable to maintain at least a first data set and a second data set, where the first data set completed a first defined amount of processing by the data processing circuit without converging, and the second data set is yet to complete a second defined amount of processing by the data processing circuit. The kick out circuit is operable to compare an attribute of the second data set to a corresponding attribute of the first data set to determine whether the second data set will be maintained in the input buffer for additional processing after the second defined amount of processing by the data processing circuit. Each of the first data set and the second data set are selectable as the processing input.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
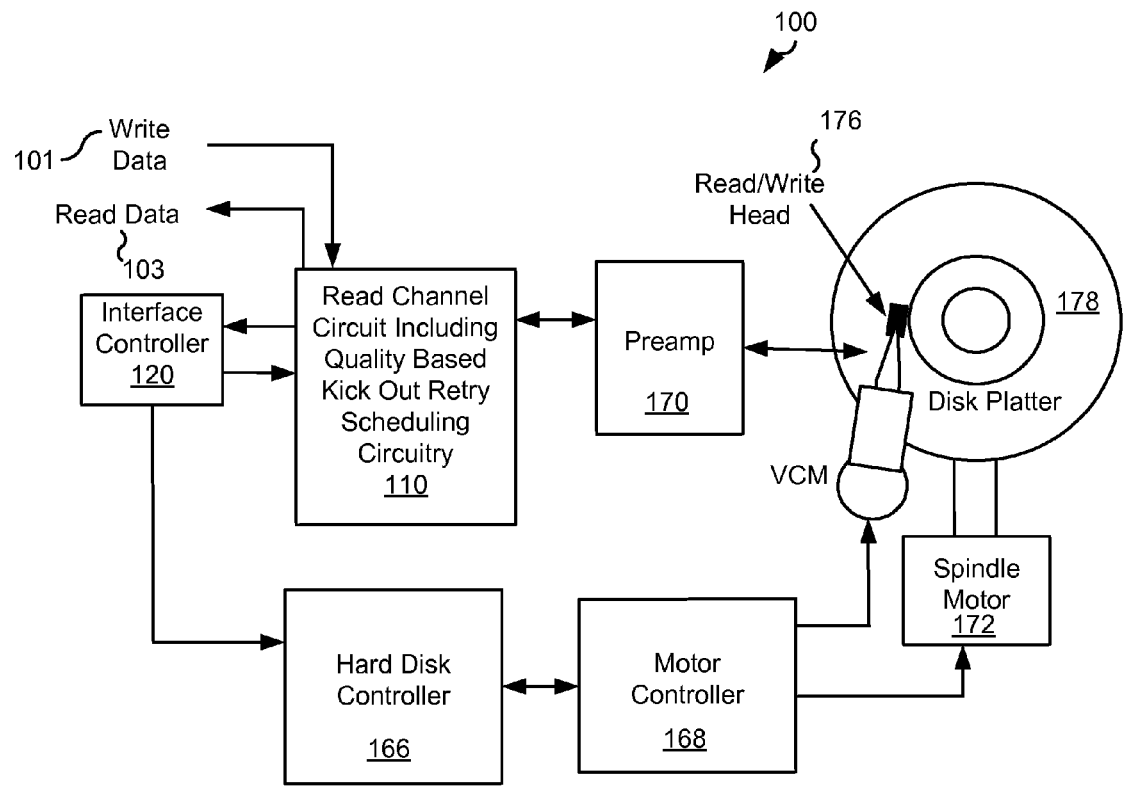
FIG. 1 shows a storage system including quality based kick out retry scheduling circuitry in accordance with various embodiments of the present invention.

Systems, circuits, devices and/or methods related to systems and methods for data processing, and more particularly to systems and methods for re-processing data sets not successfully processed during standard processing.

Various embodiments of the present invention provide data processing systems employ combinations of on-the-fly retry processing or offline retry processing and either out of order processing or in order processing. In the processing, higher quality data sets may be selected for processing prior to lower quality data sets. Higher quality data sets are expected to converge more quickly than lower quality data sets, and by allowing the higher quality data sets to be processed before lower quality data sets regardless of the order in which they are received lowers the average latency for a data set between introduction to the data processing circuit and reporting at the output of the data processing circuit.

Retry processing (either on-the-fly or offline) is supported by maintaining data sets in an input buffer as retry data sets until reprocessing bandwidth becomes available. As such, there is a potential for the input buffer to be too full with other retry data sets to accept another data set to await retry. In such a situation, a priority based selection is performed to maintain the retry data sets that exhibit a higher probability of succeeding during the retry processing. In some cases, the priority based selection is made based upon one or more quality metrics associated with the data set that most recently failed to converge and each of the other retry data sets maintained in the input buffer.

The data processing systems may include a data detector circuit and a data decoding circuit. Processing through both the data detector circuit and the data decoding circuit is considered a "global iteration". The data decoding circuit may repeatedly apply a data decoding algorithm to a processing data set during a given global iterations. Each application of the data decoding algorithm during a given global iteration is referred to as a "local iteration". As used herein, "standard processing" of a data set is done within a defined number of global and/or local iterations, or a number of global and/or local iterations limited by the addition of new data sets into an input buffer by the data processing systems to await processing by the data detector circuit and/or data decoder circuit. Additional processing of a data set that failed to converge during standard processing is referred to herein as "retry processing". A data set progressing during standard processing is considered herein as a "normal data set". A normal data set is re-classified as a "retry data set" where it completes standard processing without convergence and awaits or is progressing during retry processing.

Various embodiments of the present invention provide data processing systems that include: a data processing circuit, an input buffer, and a kick out circuit. The data processing circuit is operable to apply a data processing algorithm to a processing input to yield a data output. The input buffer is operable to maintain at least a first data set and a second data set, where the first data set completed a first defined amount of processing by the data processing circuit without converging, and the second data set is yet to complete a second defined amount of processing by the data processing circuit. The kick out circuit is operable to compare an attribute of the second data set to a corresponding attribute of the first data set to determine whether the second data set will be maintained in the input buffer for additional processing after the second defined amount of processing by the data processing circuit. Each of the first data set and the second data set are selectable as the processing input.

In some instances of the aforementioned embodiments, the first defined amount of processing by the data processing circuit is the same as the second defined amount of processing by the data processing circuit. In various instances of the aforementioned embodiments, the attribute of the second data set is a number of unsatisfied checks remaining at the end of the second defined amount of processing by the data processing circuit, and the corresponding attribute of the first data set is a number of unsatisfied checks remaining at the end of the first defined amount of processing by the data processing circuit.

In one or more instances of the aforementioned embodiments, the data processing circuit includes a detector circuit and a decoder circuit. The detector circuit is operable to apply a data detection algorithm to the processing input to yield a detected output, and decoder circuit is operable to apply a data decode algorithm to a decoder input derived from the detected output to yield the data output. In some such instances, the attribute of the second data set is a number of global iterations through both the data detector circuit and the data decoder circuit applied to the second data set during the second defined amount of processing by the data processing circuit, and the corresponding attribute of the first data set is a number of global iterations through both the data detector circuit and the data decoder circuit applied to the first data set during the first defined amount of processing by the data processing circuit. In other such instances, the attribute of the second data set is a combination of a number of global iterations through both the data detector circuit and the data decoder circuit applied to the second data set during the second defined amount of processing by the data processing circuit and a number of unsatisfied checks remaining at the end of the second defined amount of processing by the data processing circuit, and the corresponding attribute of the first data set is combination of a number of global iterations through both the data detector circuit and the data decoder circuit applied to the first data set during the first defined amount of processing by the data processing circuit and a number of unsatisfied checks remaining at the end of the first defined amount of processing by the data processing circuit.

Turning to FIG. 1, a storage system 100 including a read channel circuit 110 having quality based kick out retry scheduling circuitry in accordance with various embodiments of the present invention is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a combination of on-the-fly retry processing or offline retry processing and either out of order processing or in order processing. In particular, where a data set fails to converge it may be re-processed using retry processing. The retry processing is applied to the data set if either there is sufficient space remaining in an input buffer to maintain the data set that failed to converge, or if the data set that failed to converge exhibits a higher quality than at least one other retry data set currently maintained in the input buffer. By selectively maintaining higher quality retry data sets, the likelihood of the retry processing should increase. In some cases, read channel circuit 110 may be implemented to include a data processing circuit similar to that discussed below in relation to FIG. 3. Further, the processing may be accomplished consistent with one of the approaches discussed below in relation to FIGS. 4a-4e, or FIGS. 5a-5b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
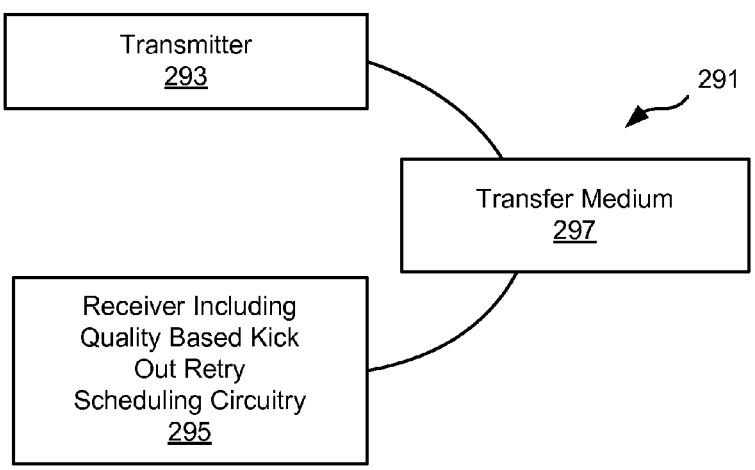
FIG. 2 depicts a data transmission system including quality based kick out retry scheduling circuitry in accordance with one or more embodiments of the present invention.

Turning to FIG. 2, a data transmission system 291 including a receiver 295 having parallel retry processing circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data.

As part of processing the received information, receiver 295 utilizes a combination of on-the-fly retry processing or offline retry processing and either out of order processing or in order processing. In particular, where a data set fails to converge it may be re-processed using retry processing. The retry processing is applied to the data set if there is either sufficient space remaining in an input buffer to maintain the data set that failed to converge, or if the data set that failed to converge exhibits a higher quality than at least one other retry data set currently maintained in the input buffer. By selectively maintaining higher quality retry data sets, the likelihood of the retry processing should increase. In some cases, read channel circuit 110 may be implemented to include a data processing circuit similar to that discussed below in relation to FIG. 3. Further, the processing may be accomplished consistent with one of the approaches discussed below in relation to FIGS. 4a-4e, or FIGS. 5a-5b.

Figure 3:
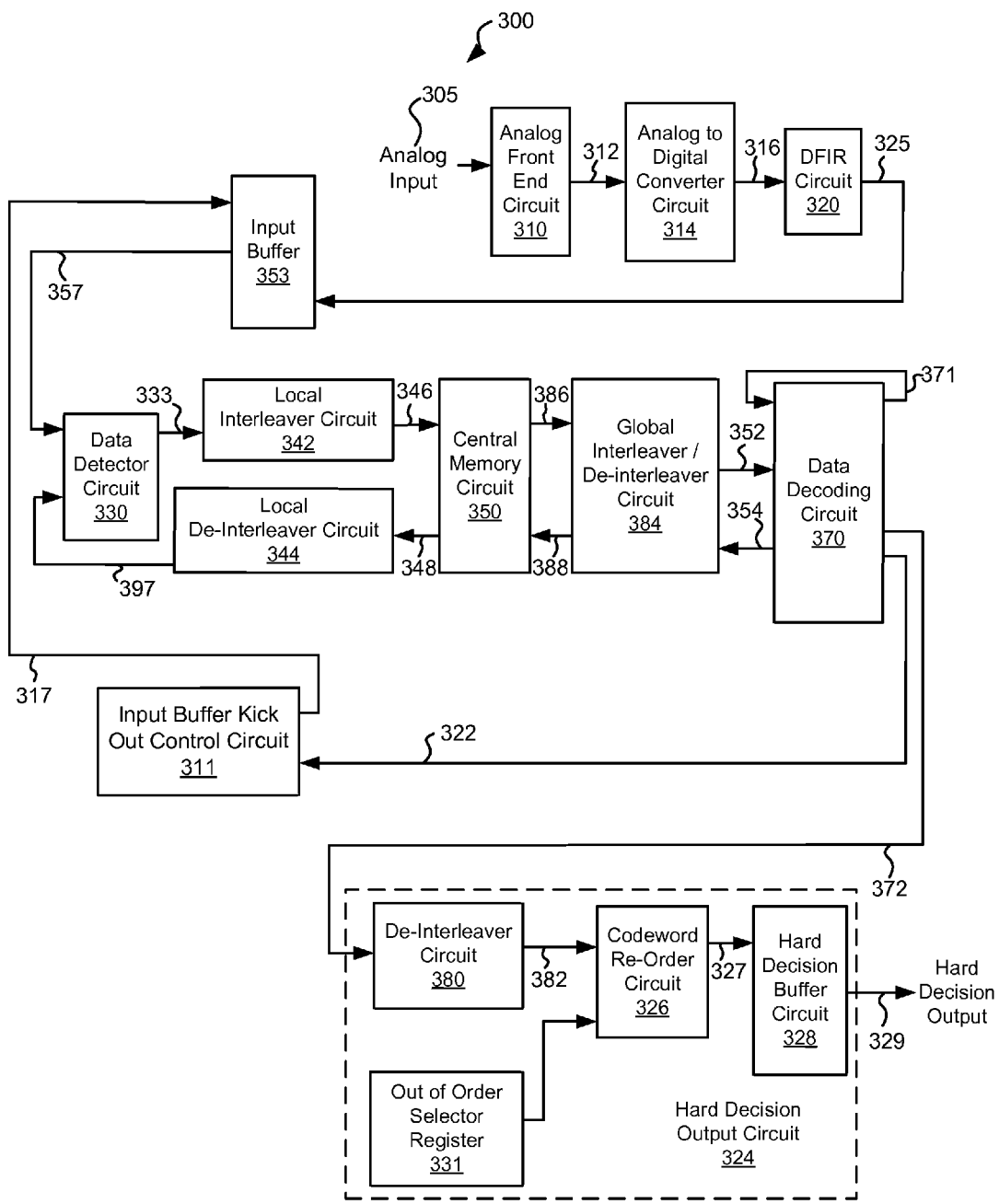
FIG. 3 shows a data processing circuit including quality based kick out retry scheduling circuitry in accordance with some embodiments of the present invention.

FIG. 3 shows a data processing circuit 300 including quality based kick out retry scheduling circuitry in accordance with one or more embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and a data decoding circuit 370 including, where warranted, multiple global iterations (passes through both data detector circuit 330 and data decoding circuit 370) and/or local iterations (passes through data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass trough data decoder circuit 370) is desired, data decoding circuit 370 re-applies the data decode algorithm to decoder input 352 guided by decoded output 371. This continues until either a maximum number of local iterations is exceeded or decoded output 371 converges (i.e., completion of standard processing).

Where decoded output 371 fails to converge (i.e., fails to yield the originally written data set) and a number of local iterations through data decoder circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a hard decision output circuit 324. Hard decision output circuit 324 includes a de-interleaver circuit 380 that rearranges the data to reverse both the global and local interleaving applied to the data to yield a de-interleaved output 382. De-interleaved output 382 is provided to a codeword re-order circuit 326 that arranges the received codeword along with other previously received codewords in an order expected by a requesting host processor. In some cases, for example, thirty-two codewords may be requested by a host in one request. Codeword re-order circuit 326 assembles the requested thirty-two codewords in a desired order and provides the ordered codewords as a codeword block 327. Codeword block 327 is not provided until all of the requested thirty-two codewords are available where an out of order control is de-asserted by an out of order selector register 331. Out of order selector register 331 is programmable to control whether out of order reporting is allowed or not. A hard decision buffer circuit 328 buffers the codeword block 327 as it is transferred to the requesting host as a hard decision output 329. Alternatively, where the out of order control is asserted by out of order selector register 331 codeword-reorder circuit 326 reports the codewords as the are received via hard decision buffer circuit 328. Allowing data to be reported out of order avoids increases in latency for a converging codeword due to the failure of other codewords to converge.

Where decoded output 371 fails to converge (i.e., fails to yield the originally written data set), a number of local iterations through data decoder circuit 370 exceeds a threshold, and no more global iterations are allowed during standard processing of the corresponding data set maintained in input buffer 353, the data set is identified as a "retry data set" and on-the-fly retry processing or offline retry processing is performed. Such on-the-fly retry processing is retry processing of a retry data set may be performed in parallel with standard processing of a normal data set, while in offline retry processing is performed after standard processing is completed. Retry processing is instigated by a feedback signal 322 to an input buffer kick out control circuit 311. In particular, feedback signal 322 indicates a failure to converge during standard processing, a number of unsatisfied checks remaining after standard processing, and/or the number of global iterations previously applied to the data set. Where there is room in input buffer 353 to maintain another retry data set the retry data set is maintained in input buffer 353, and a quality metric calculated based upon one or both of the number of unsatisfied checks and the number of global iterations applied is maintained by input buffer kick out control circuit 311. Alternatively, where there is insufficient room in input buffer 353 to maintain another retry data set the retry data set, a quality metric calculated based upon one or both of the number of unsatisfied checks and the number of global iterations applied is determined by input buffer kick out control circuit 311, and that quality metric is compared with corresponding quality metrics associated with retry data sets currently maintained in input buffer 353. Where the quality metric associated with the new retry data set is better than that of another retry data set currently maintained in the input buffer 353, the retry data set exhibiting the lowest quality is removed from input buffer 353 and effectively replaced by the most recent data set that failed to converge. In this way, where input buffer 353 is too small to accommodate all retry data sets, retry processing is applied to the retry data sets that provide the highest probability of convergence.

To differentiate between those retry data sets which have completed standard processing without completing, data sets in input buffer 353 that have not yet completed their allotment of global and local iterations are referred to as "normal data sets". Additional retry processing of a retry data set is enabled by a data processing controller and scheduling circuit (not shown) as is known in the art.

Figure 4A:
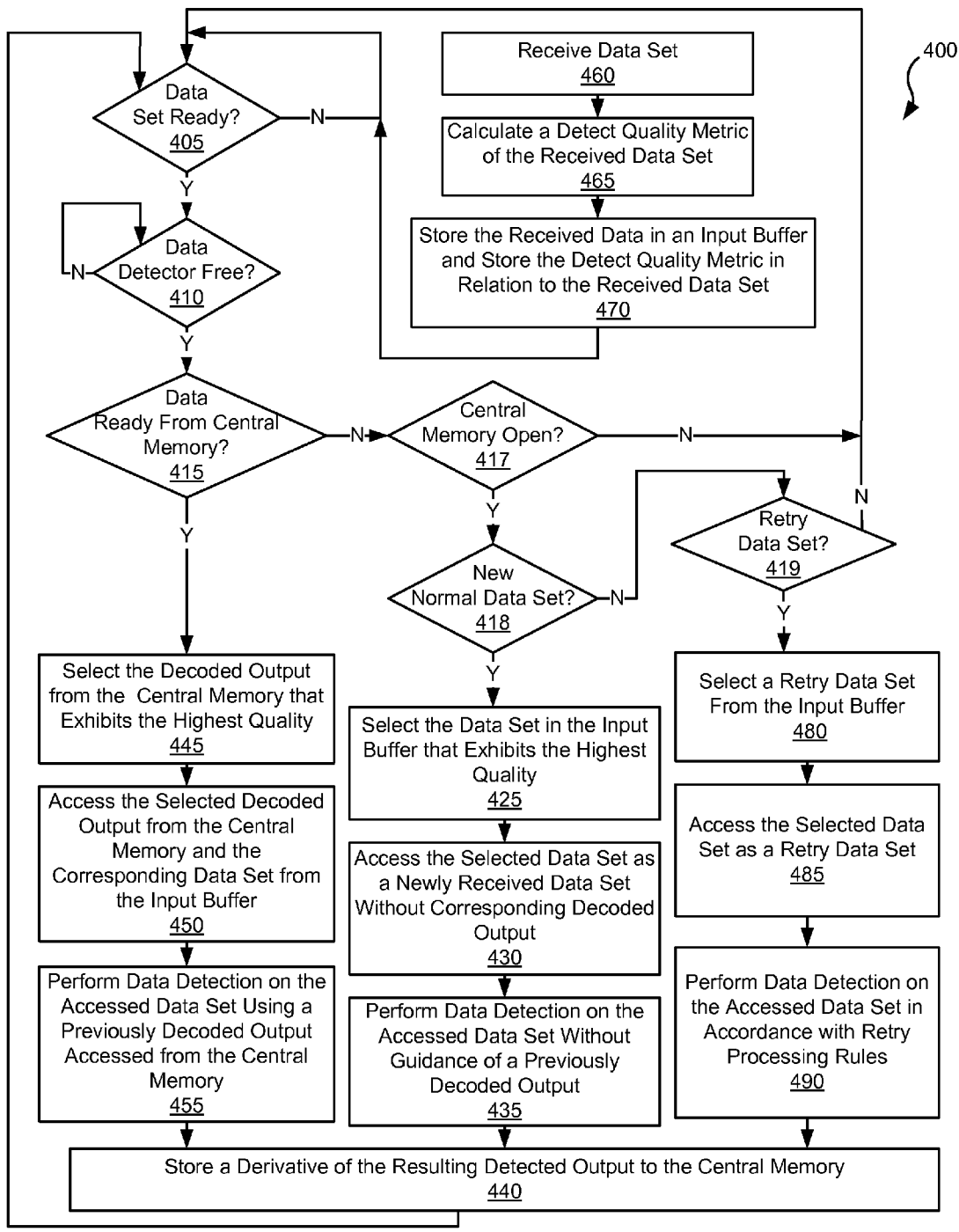
FIGS. 4a-4e are flow diagrams showing a method for data processing including quality based kick out retry scheduling in accordance with some embodiments of the present invention.

FIG. 4a is a flow diagram 400 showing a method for data processing including quality based kick out retry scheduling in accordance with some embodiments of the present invention. Following flow diagram 400 a data set is received (block 460). This data set may be derived or received from, for example, a storage medium or a communication medium. As the data set is received, a detect quality metric is calculated for the data set (block 465). This calculation may include, for example, applying a data detection algorithm or processed to the data set to yield a detected output, and subtracting the detected output from corresponding instances of the received data set to yield an error. The resulting series of errors are then used to calculate a mean squared error value across a number of instances corresponding to a codeword. The mean squared error value is the detect quality metric. Based upon the disclosure provided herein, one of ordinary skill in the art will recognize other priority metrics that may be used in relation to different embodiments of the present invention. The received data set is stored in an input buffer and the detect quality metric is stored in relation to the received data set (block 470).

It is repeatedly determined whether a data set is ready for processing (block 405). A data set may become ready for processing where either the data set was previously processed and a data decode has completed in relation to the data set and the respective decoded output is available in a central memory, or where a previously unprocessed data set becomes available in the input buffer. Where a data set is ready (block 405), it is determined whether a data detector circuit is available to process the data set (block 410).

Where the data detector circuit is available for processing (block 410), it is determined whether there is a decoded output in the central memory that is ready for additional processing (block 415). Where there is a decoded output available in the central memory (block 415), the available decoded output in the central memory that exhibits the highest quality is selected (block 445). The highest quality is the decoded output that corresponds to a decode quality metric (see block 441) with the lowest value. In some cases, only one decoded output is available in the central memory. In such cases, the only available decoded output is selected. The data set corresponding to the selected decoded output is accessed from the input buffer and the selected decoded output is accessed from the central memory (block 450), and a data detection algorithm is applied to the data set (i.e., the second or later global iteration of the data set) using the accessed decoded output as guidance (block 455). Application of the data detection algorithm yields a detected output. A derivative of the detected output is stored to the central memory (block 440). The derivative of the detected output may be, for example, an interleaved or shuffled version of the detected output.

Alternatively, where there is not a decoded output in the central memory (block 415), it is determined whether there is sufficient room in the central memory to receive a detected output (block 417). Where there is not sufficient room in the central memory (block 417), the processing returns to block 405 and the data detector circuit is idled. Alternatively, where there is sufficient room in the central memory (block 417), it is determined whether there is a new normal data set awaiting processing in the input buffer (block 418), or a retry data set awaiting processing in the input buffer (block 419). Where there is a new normal data set available (block 418), one of the new data sets in the input buffer that exhibits the highest quality is selected (block 425). The highest quality is the data set that corresponds to the detect quality metric with the lowest value. In some cases, only one previously unprocessed or new data set is available in the input buffer. In such cases, the only available data set is selected. The selected data set is accessed from the input buffer (block 430) and a data detection algorithm is applied to the newly received data set (i.e., the first global iteration of the data set) without guidance of a previously decoded output (block 435). In some cases, the data detection algorithm is a Viterbi algorithm data detector circuit or a maximum a posteriori data detector circuit. Application of the data detection algorithm yields a detected output. A derivative of the detected output is stored to the central memory (block 440). The derivative of the detected output may be, for example, an interleaved or shuffled version of the detected output.

Where a new normal data set is not available (block 418) and a retry data set is available (block 419), one of the available retry data sets is selected from the input buffer (block 480) and accessed from the input buffer as a retry data set (block 485). A data detection algorithm is applied to the retry data set in accordance with retry processing rules to yield a detected output (block 490). The retry processing rules may be different from standard data detection and include, but not be limited to, using a previously failed identification of unsatisfied checks or a previously available decode output to guide processing. One of ordinary skill in the art will recognize a variety of modifications of a standard data detection processing that may be applied to a data set that failed to converge during such standard processing. A derivative of the detected output is stored to the central memory (block 440). The derivative of the detected output may be, for example, an interleaved or shuffled version of the detected output. Otherwise, where a retry data set is not available (block 419), the processing returns to block 405 and the data detector circuit is idled.

Figure 4B:
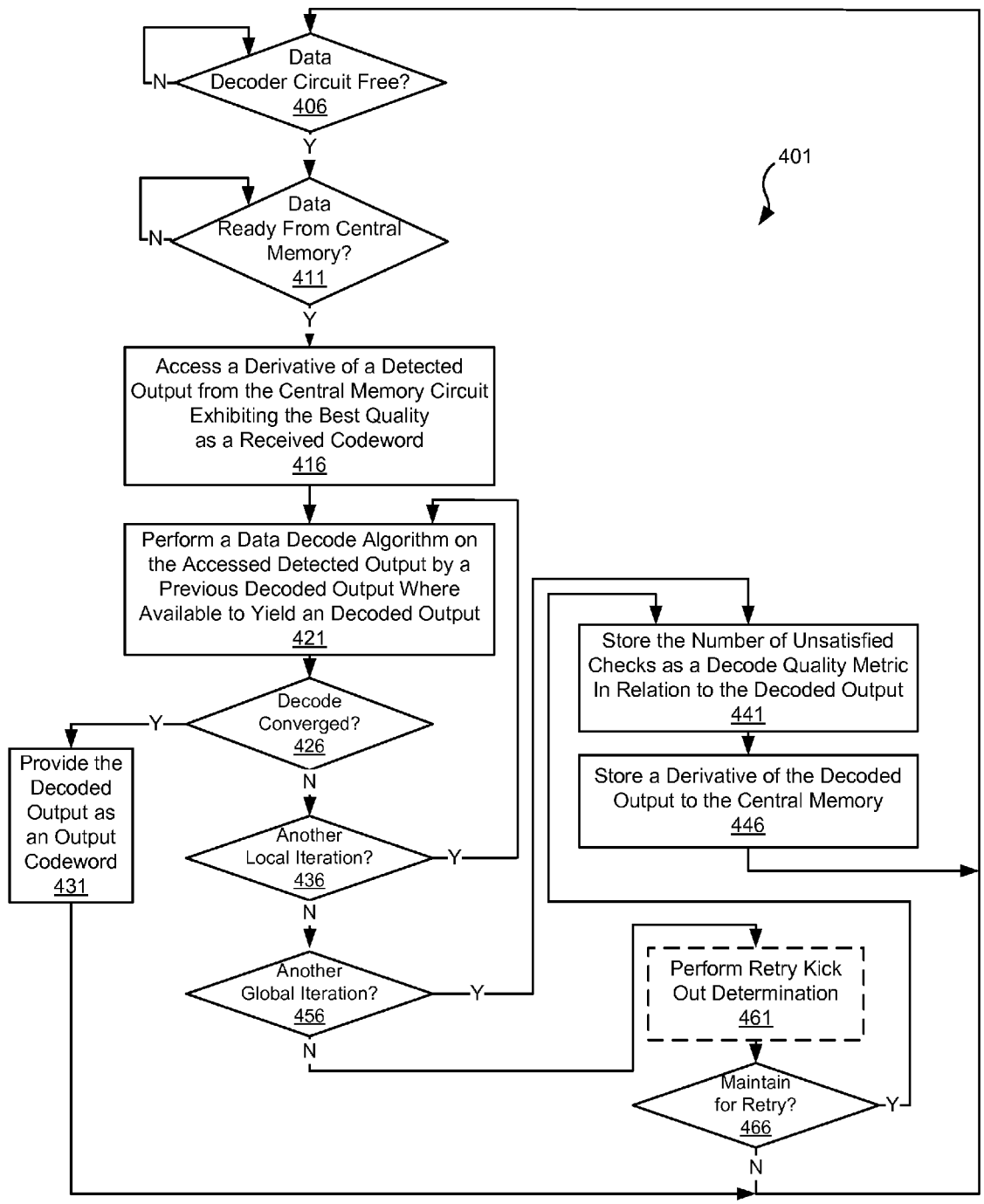

Turning to FIG. 4b, a flow diagram 401 shows a counterpart of the method described above in relation to FIG. 4a. Following flow diagram 401, in parallel to the previously described data detection process of FIG. 4a, it is determined whether a data decoder circuit is available (block 406). The data decoder circuit may be, for example, a low density data decoder circuit as are known in the art. Where the data decoder circuit is available (block 406), it is determined whether a derivative of a detected output is available for processing in the central memory (block 411). Where such a data set is ready (block 411), the previously stored derivative of a detected output that exhibits the best quality is accessed from the central memory and used as a received codeword (block 416). The best quality is based on a decode quality metric for detected outputs on their second or later global iteration, or on a detect quality metric for detected outputs on their first global iteration. A data decode algorithm is applied to the received codeword to yield a decoded output (block 421). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 426). Where the decoded output converged (block 426), it is provided as an output codeword (block 431). Alternatively, where the decoded output failed to converge (block 426), it is determined whether another local iteration is desired (block 436). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 436), the processes of blocks 421-436 are repeated for the codeword.

Alternatively, where another local iteration is not desired (block 436), it is determined whether another global iteration is allowed for the currently processing codeword (block 456). The number of global iterations allowed may be fixed or may be based upon the congestion in the data processing circuit. Where another global iteration is allowed (block 456), the number of unsatisfied checks are stored as the decode quality metric in relation to the decoded output (block 441), and a derivative of the decoded output is stored to the central memory (block 446). The derivative of the decoded output being stored to the central memory triggers the data set ready query of block 405 to begin the data detection process.

Alternatively, where another global iteration is not allowed (i.e., standard processing completed without resulting in convergence of the codeword)(block 456), a retry kick out determination is performed to determine whether the currently processing codeword will be designated a retry data set for additional processing (block 461). This retry kick out determination may be performed in a variety of ways including those described below in relation to FIGS. 4c-4e. Where it is determined that the data set will be maintained in the input buffer as a retry data set (block 466), the number of unsatisfied checks are stored as the decode quality metric in relation to the decoded output (block 441), and a derivative of the decoded output is stored to the central memory (block 446). Again, storing the derivative of the decoded output to the central memory triggers the data set ready query of block 405 to begin the data detection process.

Figure 4C:
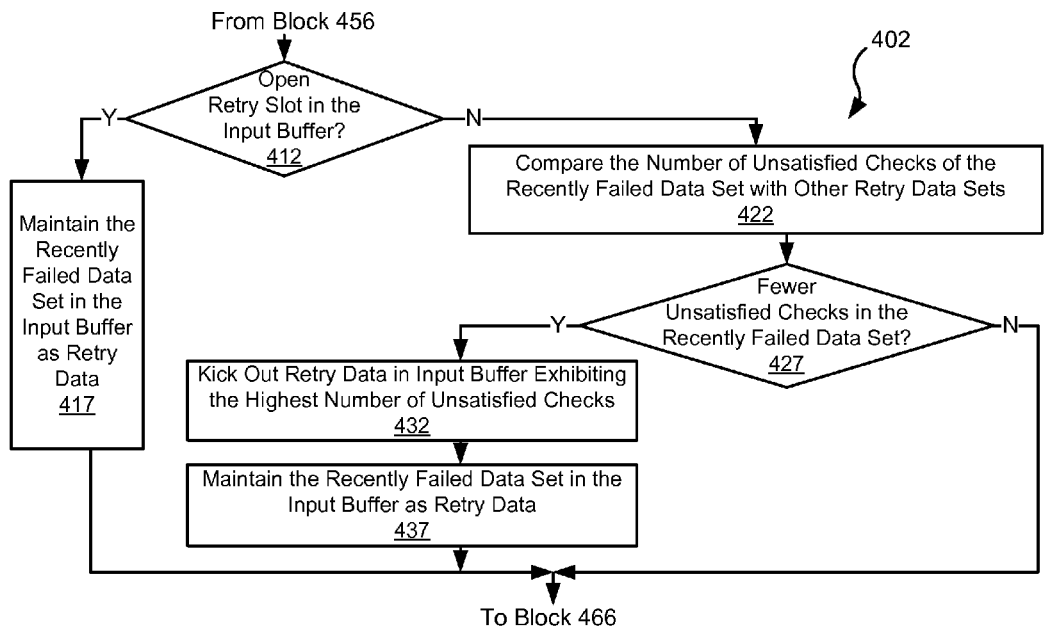

Turning to FIG. 4c, a flow diagram 402 shows one approach for performing retry kick out determination of block 461 based on a number of remaining unsatisfied checks in accordance with various embodiments of the present invention. Following flow diagram 402, it is determined whether there is sufficient room in the input buffer to maintain another retry data set (block 412). Where there is sufficient room in the input buffer (block 412), the recently failed data set is designated as a retry data set and maintained in the input buffer (block 417). Alternatively, where there is insufficient room in the input buffer (block 412), the number of unsatisfied checks remaining after completion of standard processing of the data set is compared with the number of remaining unsatisfied checks for each of the other respective retry data sets currently maintained in the input buffer (block 422). Where the number of unsatisfied checks remaining for the most recent data set is greater than or equal to that of the other respective retry data sets currently maintained in the input buffer (block 427), the most recent data set is not retained for retry processing. Otherwise, where the number of unsatisfied checks remaining for the most recent data set is less than that of at least one of the other respective retry data sets currently maintained in the input buffer (block 427), the retry data set in the input buffer exhibiting the highest number of unsatisfied checks is kicked out of the input buffer (block 432) and the most recent data set is designated as a retry data set and maintained in the input buffer (block 437).

Figure 4D:
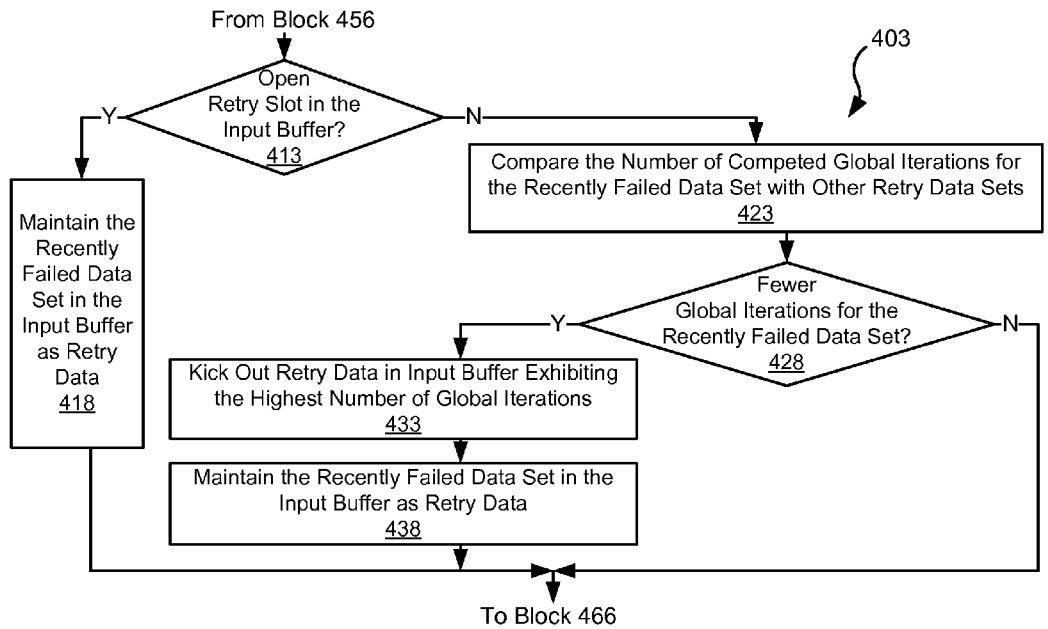

Turning to FIG. 4d, a flow diagram 403 shows one approach for performing retry kick out determination of block 461 based on a number of global iterations performed during standard processing. Following flow diagram 403, it is determined whether there is sufficient room in the input buffer to maintain another retry data set (block 413). Where there is sufficient room in the input buffer (block 413), the recently failed data set is designated as a retry data set and maintained in the input buffer (block 418). Alternatively, where there is insufficient room in the input buffer (block 413), the number of global iterations applied during standard processing of the data set is compared with the number of global iterations applied during standard processing to each of the other respective retry data sets currently maintained in the input buffer (block 423). Where the number of global iterations for the most recent data set is greater than or equal to that of the other respective retry data sets currently maintained in the input buffer (block 428), the most recent data set is not retained for retry processing. Otherwise, where the number of global iterations for the most recent data set is less than that of at least one of the other respective retry data sets currently maintained in the input buffer (block 428), the retry data set in the input buffer exhibiting the highest number of global iterations checks is kicked out of the input buffer (block 433) and the most recent data set is designated as a retry data set and maintained in the input buffer (block 438).

Figure 4E:
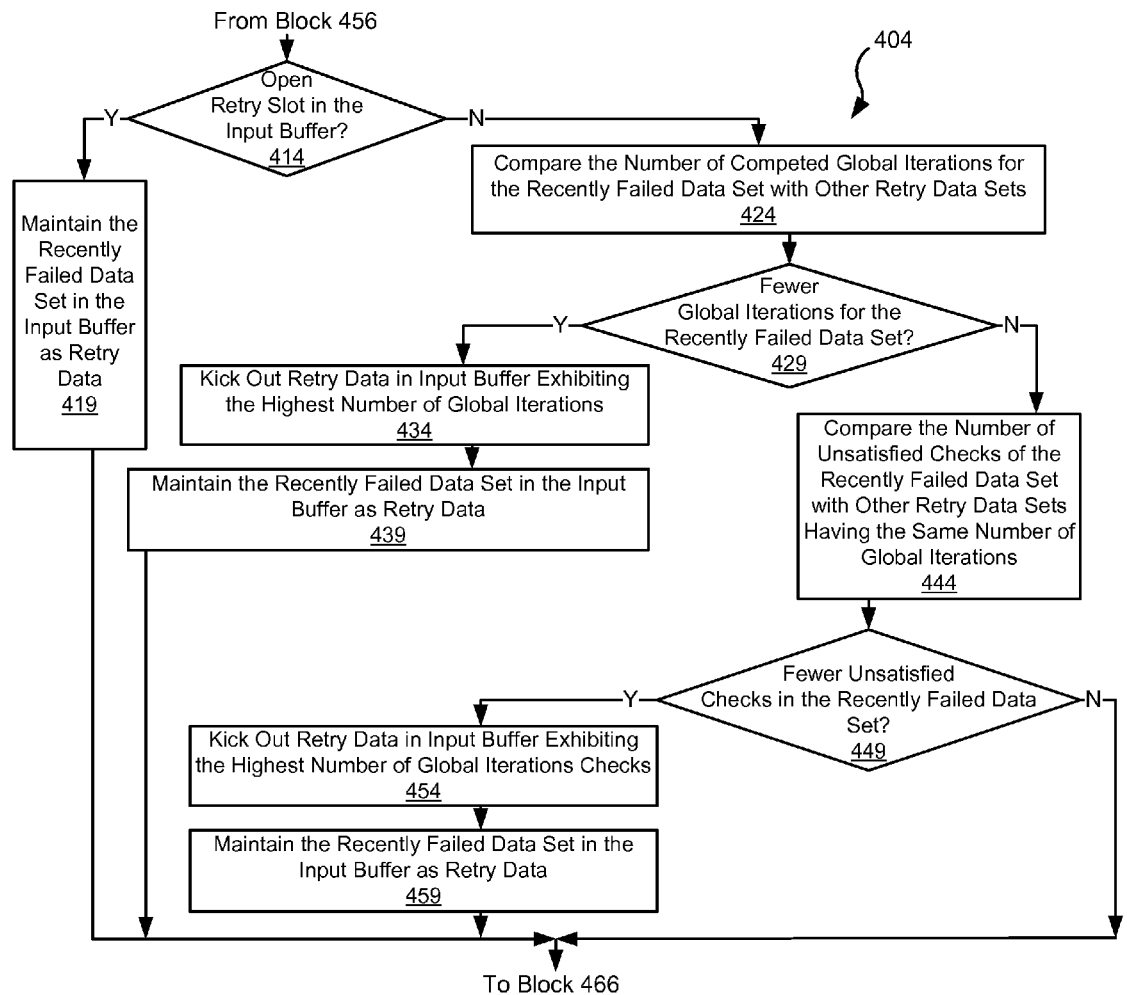

Turning to FIG. 4e, a flow diagram 404 shows one approach for performing retry kick out determination of block 461 based on a combination of a number of global iterations performed during standard processing and a number of unsatisfied checks remaining after standard processing. Following flow diagram 404, it is determined whether there is sufficient room in the input buffer to maintain another retry data set (block 414). Where there is sufficient room in the input buffer (block 414), the recently failed data set is designated as a retry data set and maintained in the input buffer (block 419). Alternatively, where there is insufficient room in the input buffer (block 414), the number of global iterations applied during standard processing of the data set is compared with the number of global iterations applied during standard processing to each of the other respective retry data sets currently maintained in the input buffer (block 424).

Where the number of global iterations for the most recent data set is greater than or equal to that of the other respective retry data sets currently maintained in the input buffer (block 429), the number of unsatisfied checks remaining after completion of standard processing of the data set is compared with the number of remaining unsatisfied checks for each of the other respective retry data sets currently maintained in the input buffer (block 444). Where the number of unsatisfied checks remaining for the most recent data set is greater than or equal to that of the other respective retry data sets currently maintained in the input buffer (block 449), the most recent data set is not retained for retry processing. Otherwise, where the number of unsatisfied checks remaining for the most recent data set is less than that of at least one of the other respective retry data sets currently maintained in the input buffer (block 449), the retry data set in the input buffer exhibiting the highest number of unsatisfied checks is kicked out of the input buffer (block 454) and the most recent data set is designated as a retry data set and maintained in the input buffer (block 459).

Alternatively, where the number of global iterations for the most recent data set is less than that of at least one of the other respective retry data sets currently maintained in the input buffer (block 429), the retry data set in the input buffer exhibiting the highest number of global iterations checks is kicked out of the input buffer (block 434) and the most recent data set is designated as a retry data set and maintained in the input buffer (block 439).

Figure 5A:
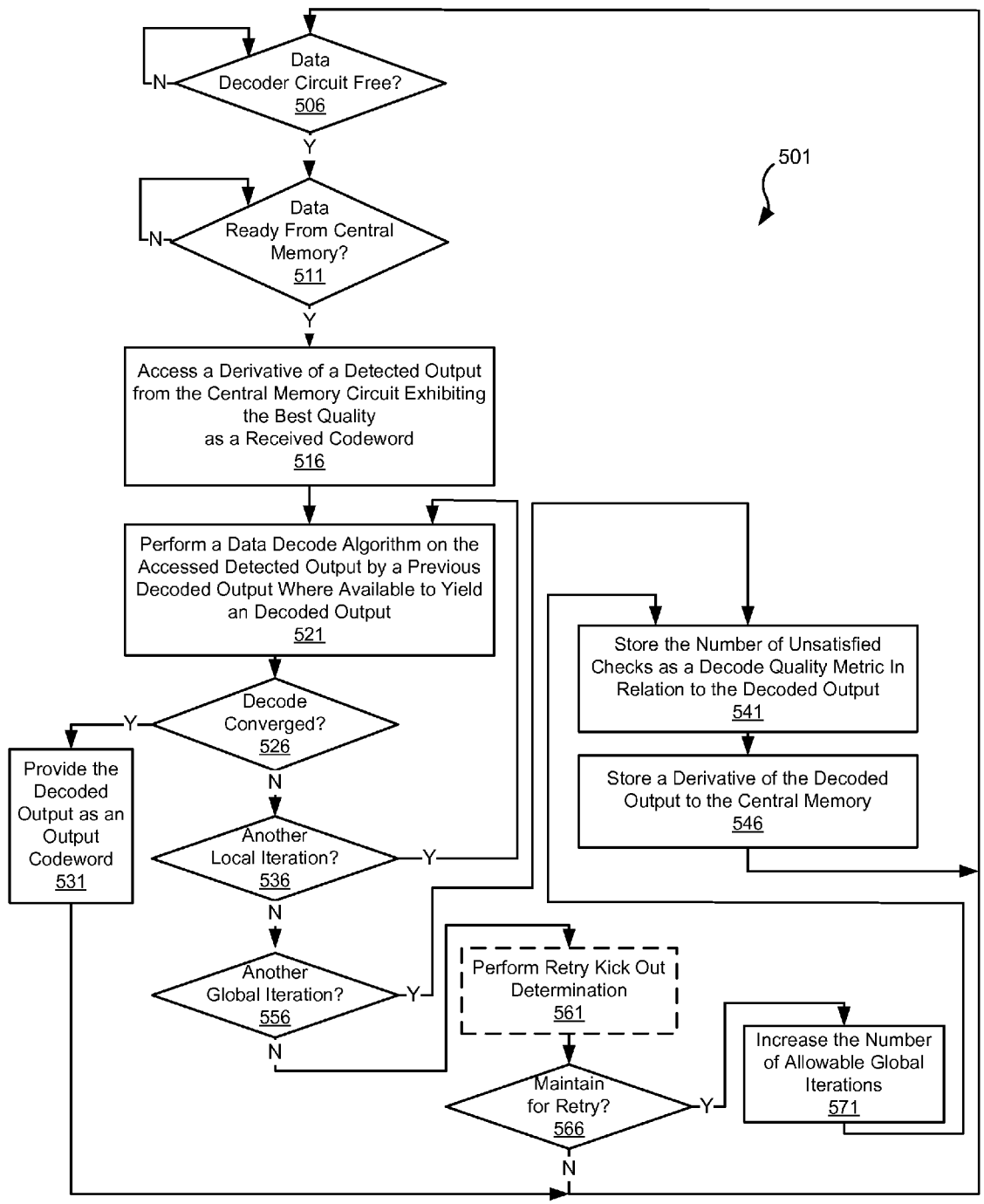
FIGS. 5a-5b are flow diagrams showing another method for data processing including quality based kick out retry scheduling in accordance with other embodiments of the present invention.
Figure 5B:
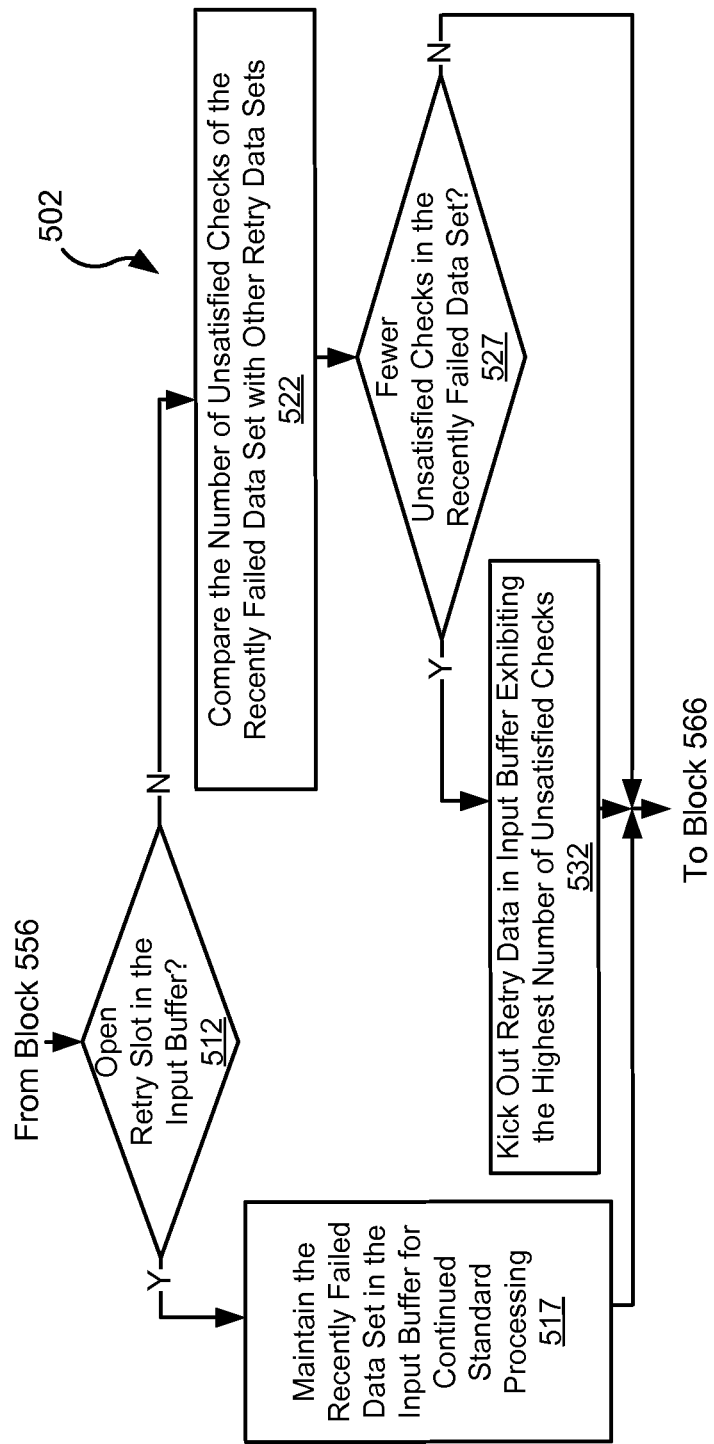

Turning to FIGS. 5a-5b, an alternative to the approach described above in relation to FIGS. 4b-4e is described. In particular, FIG. 5a is a flow diagram 501 showing a counterpart of the method described above in relation to FIG. 4a. Following flow diagram 501, in parallel to the previously described data detection process of FIG. 4a, it is determined whether a data decoder circuit is available (block 506). The data decoder circuit may be, for example, a low density data decoder circuit as are known in the art. Where the data decoder circuit is available (block 406), it is determined whether a derivative of a detected output is available for processing in the central memory (block 511). Where such a data set is ready (block 511), the previously stored derivative of a detected output that exhibits the best quality is accessed from the central memory and used as a received codeword (block 516). The best quality is based on a decode quality metric for detected outputs on their second or later global iteration, or on a detect quality metric for detected outputs on their first global iteration. A data decode algorithm is applied to the received codeword to yield a decoded output (block 521). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 526). Where the decoded output converged (block 526), it is provided as an output codeword (block 531). Alternatively, where the decoded output failed to converge (block 526), it is determined whether another local iteration is desired (block 536). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 536), the processes of blocks 521-536 are repeated for the codeword.

Alternatively, where another local iteration is not desired (block 536), it is determined whether another global iteration is allowed for the currently processing codeword (block 556). The number of global iterations allowed may be fixed or may be based upon the congestion in the data processing circuit. Where another global iteration is allowed (block 556), the number of unsatisfied checks are stored as the decode quality metric in relation to the decoded output (block 541), and a derivative of the decoded output is stored to the central memory (block 546). The derivative of the decoded output being stored to the central memory triggers the data set ready query of block 505 to begin the data detection process.

Alternatively, where another global iteration is not allowed (i.e., standard processing completed without resulting in convergence of the codeword)(block 556), a retry kick out determination is performed to determine whether the currently processing codeword will be designated a retry data set for additional processing (block 561). This retry kick out determination may be performed in a variety of ways including that described below in relation to FIG. 5b. Where it is determined that the data set will be maintained in the input buffer as a retry data set (block 566), the number of allowable global iterations is increased for the currently processing data set allowing it to continue processing (block 571). The number of unsatisfied checks are stored as the decode quality metric in relation to the decoded output (block 541), and a derivative of the decoded output is stored to the central memory (block 546). Again, storing the derivative of the decoded output to the central memory triggers the data set ready query of block 405 to begin the data detection process.

Turning to FIG. 5b, a flow diagram 502 shows one approach for performing retry kick out determination of block 561 based on a number of remaining unsatisfied checks is shown in accordance with various embodiments of the present invention. Following flow diagram 502, it is determined whether there is sufficient room in the input buffer to maintain another retry data set (block 512). Where there is sufficient room in the input buffer (block 512), the recently failed data set is maintained in the input buffer where it is used for continued standard processing (block 517). Alternatively, where there is insufficient room in the input buffer (block 512), the number of unsatisfied checks remaining after completion of standard processing of the data set is compared with the number of remaining unsatisfied checks for each of the other respective retry data sets currently maintained in the input buffer (block 522). Where the number of unsatisfied checks remaining for the most recent data set is greater than or equal to that of the other respective retry data sets currently maintained in the input buffer (block 527), the most recent data set is not retained for retry processing. Otherwise, where the number of unsatisfied checks remaining for the most recent data set is less than that of at least one of the other respective retry data sets currently maintained in the input buffer (block 427), the retry data set in the input buffer exhibiting the highest number of unsatisfied checks is kicked out of the input buffer (block 532) and the most recent data set is maintained for additional standard processing.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for priority based data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data processing circuit operable to apply a data processing algorithm to a processing input to yield a data output;
   an input buffer operable to maintain at least a first data set and a second data set, wherein the first data set completed a first defined amount of processing by the data processing circuit without converging, and wherein the second data set is yet to complete a second defined amount of processing by the data processing circuit;
   a kick out circuit operable to compare an attribute of the second data set to a corresponding attribute of the first data set to determine whether the second data set will be maintained in the input buffer for additional processing after the second defined amount of processing by the data processing circuit, wherein the attribute of the first data set and the attribute of the second data set are selected from a group consisting of:
   a non-zero number of unsatisfied checks remaining at the end of the first defined amount of processing by the data processing circuit and a non-zero number of unsatisfied checks remaining at the end of the second defined amount of processing by the data processing circuit;
   a number of global iterations through both the data detector circuit and the data decoder circuit applied to the first data set during the first defined amount of processing by the data processing circuit and a number of global iterations through both the data detector circuit and the data decoder circuit applied to the second data set during the second defined amount of processing by the data processing circuit; and
   a combination of the number of global iterations through both the data detector circuit and the data decoder circuit applied to the first data set during the first defined amount of processing by the data processing circuit and a number of unsatisfied checks remaining at the end of the first defined amount of processing by the data processing circuit, and the combination of the number of global iterations through both the data detector circuit and the data decoder circuit applied to the second data set during the second defined amount of processing by the data processing circuit and a number of unsatisfied checks remaining at the end of the second defined amount of processing by the data processing circuit; and
   wherein each of the first data set and the second data set are selectable as the processing input.

2. The data processing system of claim 1, wherein the first defined amount of processing by the data processing circuit is the same as the second defined amount of processing by the data processing circuit.

3. The data processing system of claim 1, wherein the attribute of the second data set is the non-zero number of unsatisfied checks remaining at the end of the second defined amount of processing by the data processing circuit, and the corresponding attribute of the first data set is the non-zero number of unsatisfied checks remaining at the end of the first defined amount of processing by the data processing circuit.

4. The data processing system of claim 1, wherein the data processing circuit comprises:
   a detector circuit operable to apply a data detection algorithm to the processing input to yield a detected output; and
   a decoder circuit operable to apply a data decode algorithm to a decoder input derived from the detected output to yield the data output.

5. The data processing system of claim 4, wherein the attribute of the second data set is the number of global iterations through both the data detector circuit and the data decoder circuit applied to the second data set during the second defined amount of processing by the data processing circuit, and the corresponding attribute of the first data set is the number of global iterations through both the data detector circuit and the data decoder circuit applied to the first data set during the first defined amount of processing by the data processing circuit.

6. The data processing system of claim 4, wherein the attribute of the second data set is the combination of the number of global iterations through both the data detector circuit and the data decoder circuit applied to the second data set during the second defined amount of processing by the data processing circuit and a number of unsatisfied checks remaining at the end of the second defined amount of processing by the data processing circuit, and the corresponding attribute of the first data set is the combination of the number of global iterations through both the data detector circuit and the data decoder circuit applied to the first data set during the first defined amount of processing by the data processing circuit and a number of unsatisfied checks remaining at the end of the first defined amount of processing by the data processing circuit.

7. The data processing system of claim 4, wherein the detector circuit is selected from a group consisting of: a Viterbi algorithm data detector circuit, and a maximum a posteriori data detector circuit.

8. The data processing system of claim 4, wherein the decoder circuit is a low density parity check decoder circuit.

9. The data processing system of claim 1, wherein the system is implemented as an integrated circuit.

10. The data processing system of claim 1, wherein the data processing system is incorporated in a device selected from a group consisting of: a storage device, and a data transmission device.

11. A method for data processing, the method comprising:
    providing a data processing circuit operable to apply a data processing algorithm to a processing input to yield a data output;
    providing an input buffer operable to maintain at least a first data set and a second data set, wherein the first data set completed a first defined amount of processing by the data processing circuit without converging, and wherein the second data set is yet to complete a second defined amount of processing by the data processing circuit;
    comparing an attribute of the second data set to a corresponding attribute of the first data set to determine whether the second data set will be maintained in the input buffer for additional processing after the second defined amount of processing by the data processing circuit, wherein the attribute of the first data set and the attribute of the second data set are selected from a group consisting of:

a non-zero number of unsatisfied checks remaining at the end of the first defined amount of processing by the data processing circuit and a non-zero number of unsatisfied checks remaining at the end of the second defined amount of processing by the data processing circuit;

a number of global iterations through both the data detector circuit and the data decoder circuit applied to the first data set during the first defined amount of processing by the data processing circuit and a number of global iterations through both the data detector circuit and the data decoder circuit applied to the second data set during the second defined amount of processing by the data processing circuit; and a combination of the number of global iterations through both the data detector circuit and the data decoder circuit applied to the first data set during the first defined amount of processing by the data processing circuit and a number of unsatisfied checks remaining at the end of the first defined amount of processing by the data processing circuit, and the combination of the number of global iterations through both the data detector circuit and the data decoder circuit applied to the second data set during the second defined amount of processing by the data processing circuit and a number of unsatisfied checks remaining at the end of the second defined amount of processing by the data processing circuit; and selecting each of the first data set and the second data set as the processing input at respective times.

12. The method of claim 11, wherein the first defined amount of processing by the data processing circuit is the same as the second defined amount of processing by the data processing circuit.

13. The method of claim 11, wherein the attribute of the second data set is the non-zero number of unsatisfied checks remaining at the end of the second defined amount of processing by the data processing circuit, and the corresponding attribute of the first data set is the non-zero number of unsatisfied checks remaining at the end of the first defined amount of processing by the data processing circuit.

14. The method of claim 11, wherein the data processing circuit comprises:

a detector circuit operable to apply a data detection algorithm to the processing input to yield a detected output; and a decoder circuit operable to apply a data decode algorithm to a decoder input derived from the detected output to yield the data output.

15. The method of claim 14, wherein the attribute of the second data set is the number of global iterations through both the data detector circuit and the data decoder circuit applied to the second data set during the second defined amount of processing by the data processing circuit, and the corresponding attribute of the first data set is the number of global iterations through both the data detector circuit and the data decoder circuit applied to the first data set during the first defined amount of processing by the data processing circuit.

16. The method of claim 14, wherein the attribute of the second data set is a combination of the number of global iterations through both the data detector circuit and the data decoder circuit applied to the second data set during the second defined amount of processing by the data processing circuit and a number of unsatisfied checks remaining at the end of the second defined amount of processing by the data processing circuit, and the corresponding attribute of the first data set is combination of the number of global iterations through both the data detector circuit and the data decoder circuit applied to the first data set during the first defined amount of processing by the data processing circuit and a number of unsatisfied checks remaining at the end of the first defined amount of processing by the data processing circuit.

17. The method of claim 14, wherein the detector circuit is selected from a group consisting of: a Viterbi algorithm data detector circuit, and a maximum a posteriori data detector circuit.

18. The method of claim 14, wherein the decoder circuit is a low density parity check decoder circuit.

19. A storage device, the storage device comprising:

a storage medium;

a head assembly disposed in relation to the storage medium and operable to provide a sensed signal corresponding to information on the storage medium;

a read channel circuit including:

an analog to digital converter circuit operable to sample an analog signal derived from the sensed signal to yield a series of digital samples;

an equalizer circuit operable to equalize the digital samples to yield a first data set and a second data set;

a data processing circuit operable to apply a data processing algorithm to a processing input to yield a data output;

an input buffer operable to maintain at least a first data set and a second data set, wherein the first data set completed a first defined amount of processing by the data processing circuit without converging, and wherein the second data set is yet to complete a second defined amount of processing by the data processing circuit;

a kick out circuit operable to compare an attribute of the second data set to a corresponding attribute of the first data set to determine whether the second data set will be maintained in the input buffer for additional processing after the second defined amount of processing by the data processing circuit, wherein the (a) attribute of the second data set and the (b) corresponding attribute of the first data set are selected from a group consisting of:

(1) (a) a number of unsatisfied checks remaining at the end of the second defined amount of processing by the data processing circuit, and (b) a number of unsatisfied checks remaining at the end of the first defined amount of processing by the data processing circuit;

(2) (a) a number of iterations through the data processing circuit applied to the second data set during the second defined amount of processing by the data processing circuit, and (b) a number of iterations through the data processing circuit applied to the first data set during the first defined amount of processing by the data processing circuit; and (3) (a) a combination of the number of iterations through the data processing circuit applied to the second data set during the second defined amount of processing by the data processing circuit and the number of unsatisfied checks remaining at the end of the second defined amount of processing by the data processing circuit, and (b) a combination of the number of iterations through the data processing circuit applied to the first data set during the first defined amount of processing by the data processing circuit and the number of unsatisfied checks remaining at the end of the first defined amount of processing by the data processing circuit; and wherein each of the first data set and the second data set are selectable as the processing input.

20. The storage device of claim 19, wherein the first defined amount of processing by the data processing circuit is the same as the second defined amount of processing by the data processing circuit.

* * * * *